(12) United States Patent
Negishi et al.

(10) Patent No.: US 8,167,648 B2
(45) Date of Patent: May 1, 2012

(54) LOW NOISE CONNECTOR WITH CABLES HAVING A CENTER, MIDDLE AND OUTER CONDUCTORS

(75) Inventors: Kazuki Negishi, Beaverton, OR (US); Michael Simmons, Colton, OR (US); Christopher Storm, Hillsboro, OR (US); ToeNaing Swe, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 13/030,961

(22) Filed: Feb. 18, 2011

(65) Prior Publication Data

US 2011/0207370 A1    Aug. 25, 2011

Related U.S. Application Data

(60) Provisional application No. 61/306,878, filed on Feb. 22, 2010.

(51) Int. Cl.
*H01R 9/05* (2006.01)
(52) U.S. Cl. ..................................................... 439/580
(58) Field of Classification Search .......... 439/578–580; 324/756.01, 756.03, 755.02, 750.26
See application file for complete search history.

(56) References Cited

U.S. PATENT DOCUMENTS

| | | | | |
|---|---|---|---|---|
| 6,847,219 | B1 * | 1/2005 | Lesher et al. | 324/755.02 |
| 6,914,423 | B2 * | 7/2005 | Nordgren et al. | 324/756.01 |
| 7,138,810 | B2 * | 11/2006 | Lesher et al. | 324/750.26 |
| 7,295,025 | B2 * | 11/2007 | Lesher et al. | 324/756.03 |
| 8,016,615 | B2 * | 9/2011 | Montena | 439/580 |
| 2004/0017214 | A1 | 1/2004 | Tervo et al. | |
| 2004/0207424 | A1 | 10/2004 | Hollman | |
| 2005/0215113 | A1 | 9/2005 | Khemakhem | |
| 2006/0208756 | A1 | 9/2006 | Iwasaki | |
| 2008/0054922 | A1 | 3/2008 | Lesher et al. | |
| 2009/0318020 | A1 | 12/2009 | Mulfinger et al. | |
| 2011/0300747 | A1 * | 12/2011 | Montena | 439/578 |

OTHER PUBLICATIONS

Tyco Electronics Twin BNC Connectors, Product Details. Cited in International Search Report for PCT Patent Application No. PCT/US2011/025476, dated May 12, 2011.

* cited by examiner

*Primary Examiner* — Chandrika Prasad
(74) *Attorney, Agent, or Firm* — DASCENZO Intellectual Property Law, P.C.

(57) ABSTRACT

An adapter conductively interconnects a chuck of a probe station and an instrument. The adapter includes a signal conductor conductively connected to the chuck and selectively connectable to a respective one of a ground potential, a bayonet connector output and a signal connection for the instrument. A guard potential conductor conductively connected to the chuck and selectively connectable to a one of a ground potential and a guard connection for the instrument; and a shield conductor connected to a ground potential.

16 Claims, 7 Drawing Sheets

LOW NOISE CONNECTOR WITH CABLES HAVING A CENTER, MIDDLE AND OUTER CONDUCTORS

CROSS-REFERENCE TO RELATED APPLICATIONS

The present application relates to probe stations, and in particular to probe stations with improved interconnections.

Many different test instruments have different connector requirements and/or configurations. For example, different test instruments have different connector configurations and/or sizes and/or styles. Thus for each connector configuration the user needs to select appropriate cables that are particularly suited for the available connectors. In addition, the appropriate cables may further be selected based upon the particular type of test to be performed. For example, a cable and connector suitable for a low voltage test has different characteristics than a cable and connector suitable for a high voltage and/or high current tests. For example, a cable suitable for extremely low noise measurements has different characteristics than a cable for low voltage, high voltage, and/or high current tests. Accordingly, for each of these tests using different test instruments and/or different probe stations, a different set of customized cables may need to be selected, all of which requires a large selection of cables which are burdensome to properly connect to the test instrumentation and may be difficult, if not impossible, to properly interconnect with the probe station connector.

Referring to FIG. 1, a probe station generally includes a support 10 upon which a base 12 is supported. A chuck 14 for supporting a device 20 to be tested (e.g., a semiconductor wafer) typically includes a stage 16, supported by the base 12, that permits movement of the chuck 14. The stage 16 may include x, y, z, and/or theta movements for the chuck 14 associated therewith. In many cases, the chuck 20 is fully or partially enclosed within an enclosure 22, which provides electromagnetic shielding to the device under test 20. The chuck 18 may be a multi-layered chuck having a signal connection, a guard connection, and/or a shield connection through one or more cables 24. The cables 24 may terminate at a connector 26 which is supported by the probe station. The probe station may include a platen 34 which supports one or more probe 36 for probing the device under test 20. In many configurations, the platen 24 raises and lowers the probes 36 for testing the device under test 20. The probes 36 may be electrically connected with cables 38 that terminate at the connector 26. Test instrumentation 30, for testing the device under test 20, is electrically interconnected to the connector 26 by using one or more cables 32. One exemplary probe station is described in U.S. Pat. No. 6,914,423, hereby incorporated by reference herein in its entirety.

For example, the interconnecting wires are relatively thin and the cables are relatively flexible for typical measurements. To achieve higher power usage the size of the conductive wires are substantially increased resulting in cables that are generally inflexible and difficult to use. In addition to the increased wire size for higher power usage, additional insulation is included around each of the conductive wires to increase the electrical isolation for the wires. Moreover, due to the larger wire and increased insulation, the wires are normally spaced farther apart from one another at connectors. As a result of the modifications to support higher power usages, the resulting cables may be unsuitable for interconnection with the connectors at the probe station and/or the test instrumentation normally used for lower voltage smaller connections.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 2:
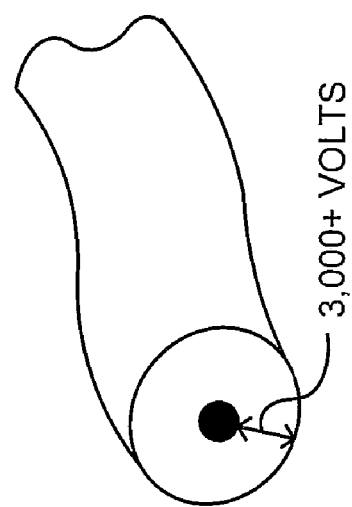
FIG. 2 illustrates a coaxial cable.

Referring to FIG. 2, one technique to characterize the power carrying capacity for a coaxial cable is the voltage capacity between the central signal conductor and the surrounding ground conductor. Preferably, in a coaxial configuration, the cables have the capability of carrying 3,000 volts or more safely.

Figure 1:
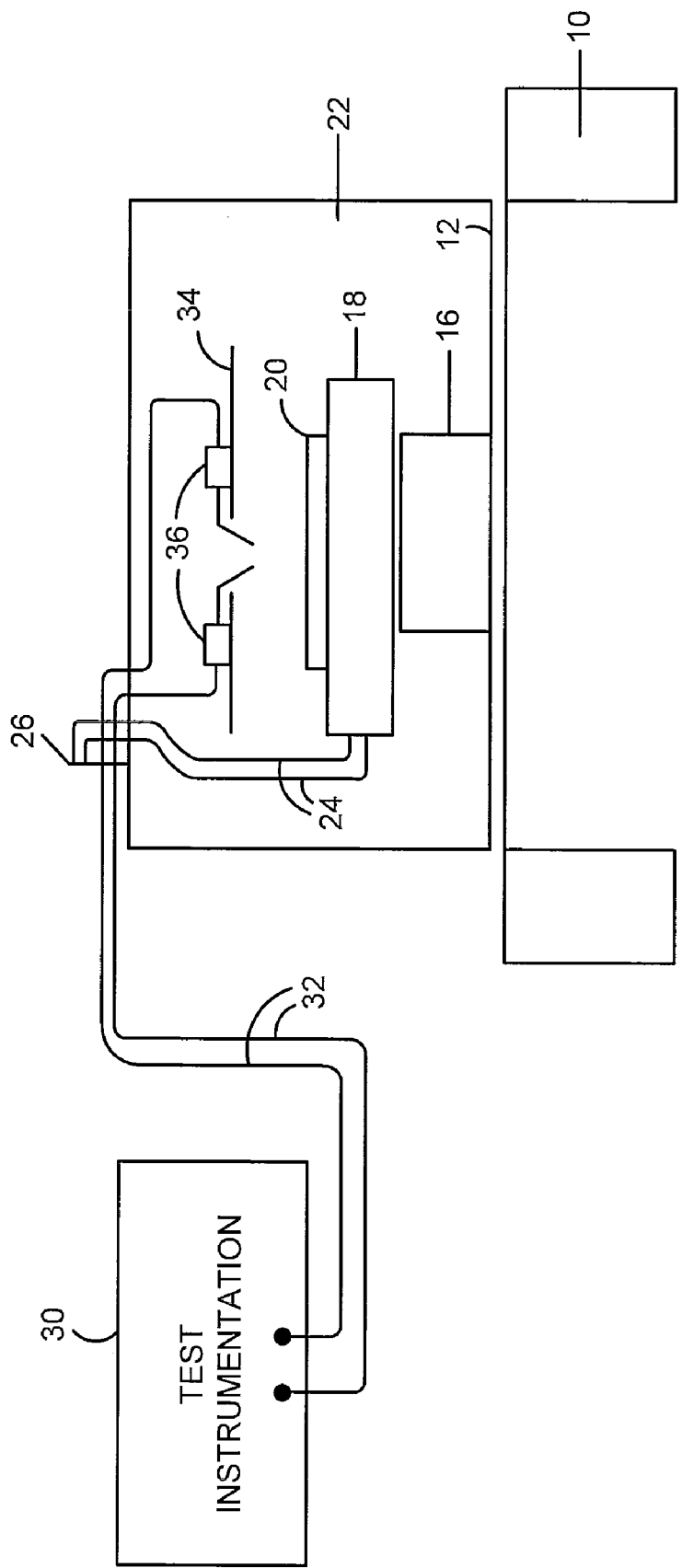
FIG. 1 illustrates a probe station with associated test instrumentation.
Figure 3:
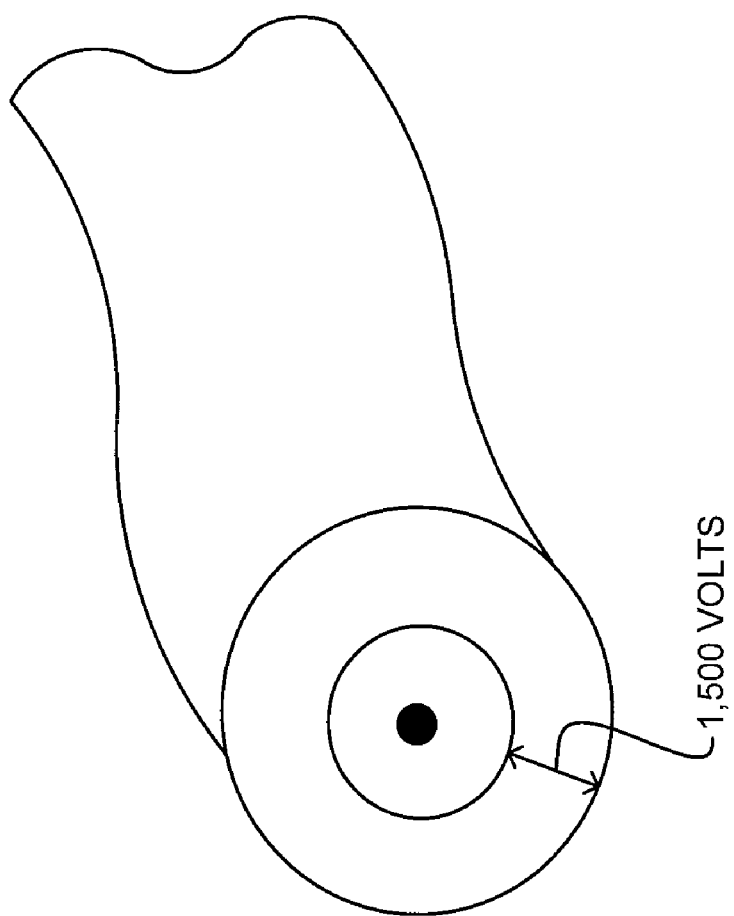
FIG. 3 illustrates a triaxial cable.

Referring to FIG. 3, one technique to characterize the power carrying capacity for a triaxial cable is the voltage capacity between the middle conductor (e.g., typically referred to as the guard conductor) surrounding the central signal conductor (e.g., typically referred to as the signal conductor) and the exterior conductor surrounding ground conductor (e.g., typically referred to as the shield conductor). The central signal conductor and the surrounding guard conductor are typically provided with substantially the same potential, i.e., a guard potential, thus reducing noise reaching the central signal conductor. Preferably, in a triaxial configuration, the cables have the capability of carrying 1,500 volts or more safely.

Figure 4:
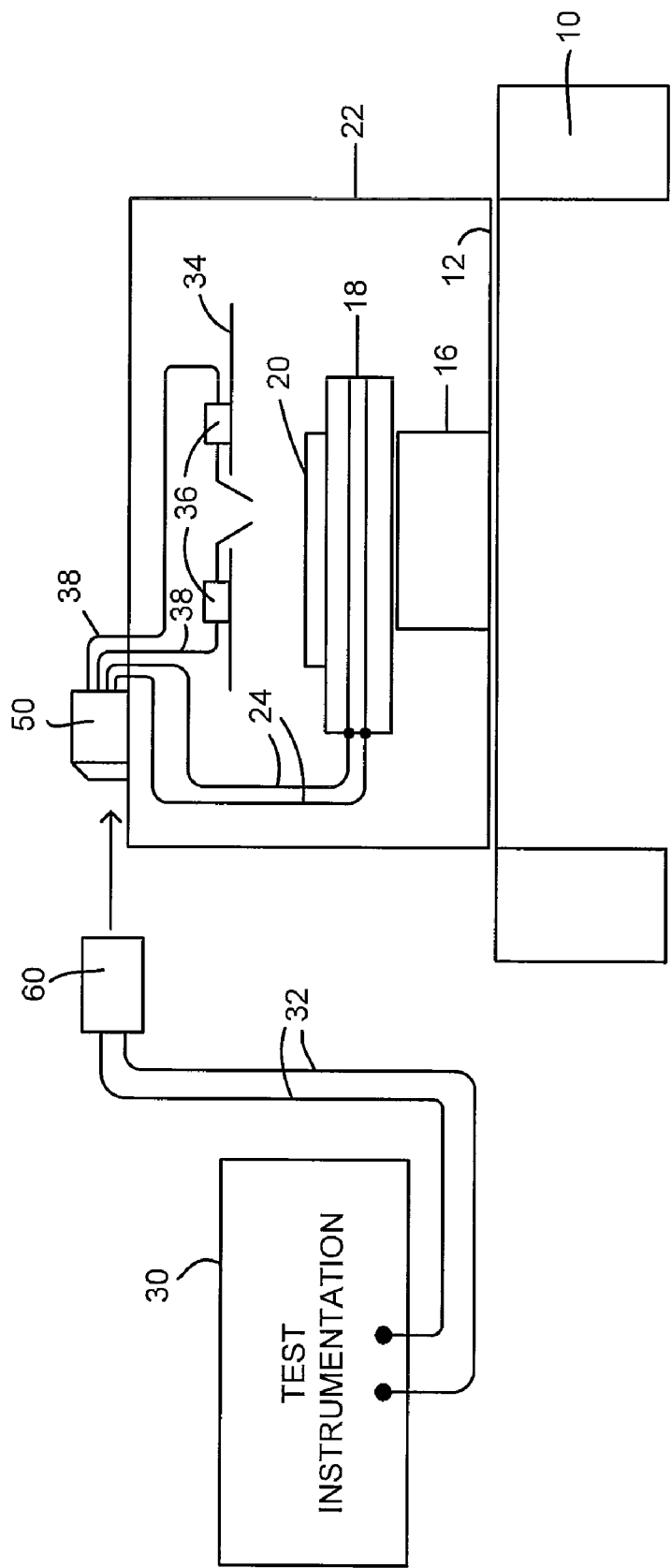
FIG. 4 illustrates a probe station with associated test instrumentation.

Referring to FIG. 4, a modified probe station configuration that is more readily adaptable to different probing configurations includes a male adapter 50 electrically interconnected to the probes 36 and/or the chuck 18. The male adapter 50 is preferably supported by the probe station in a secured position. A corresponding female adapter 60 is integrated with suitable cables 32 for the test instrumentation 30. For a particular test, the operator selects the appropriate cables for the test which are interconnected with the female adapter 60. The male and female adapters may be reversed, as desired. By way of example, an operator may have multiple cable 32 and female adapter 60 pairs, each of which are provided as a single integrated unit, to select from based upon the desired test. The female adapter 60 and male adapter 50 are suitable to pass the signals to the device under test 20, without particular concern for the particular test being performed. In this manner, upon engagement of the male adapter 50 with the female adapter 60 a suitable interconnection is created for the test.

Figure 5:
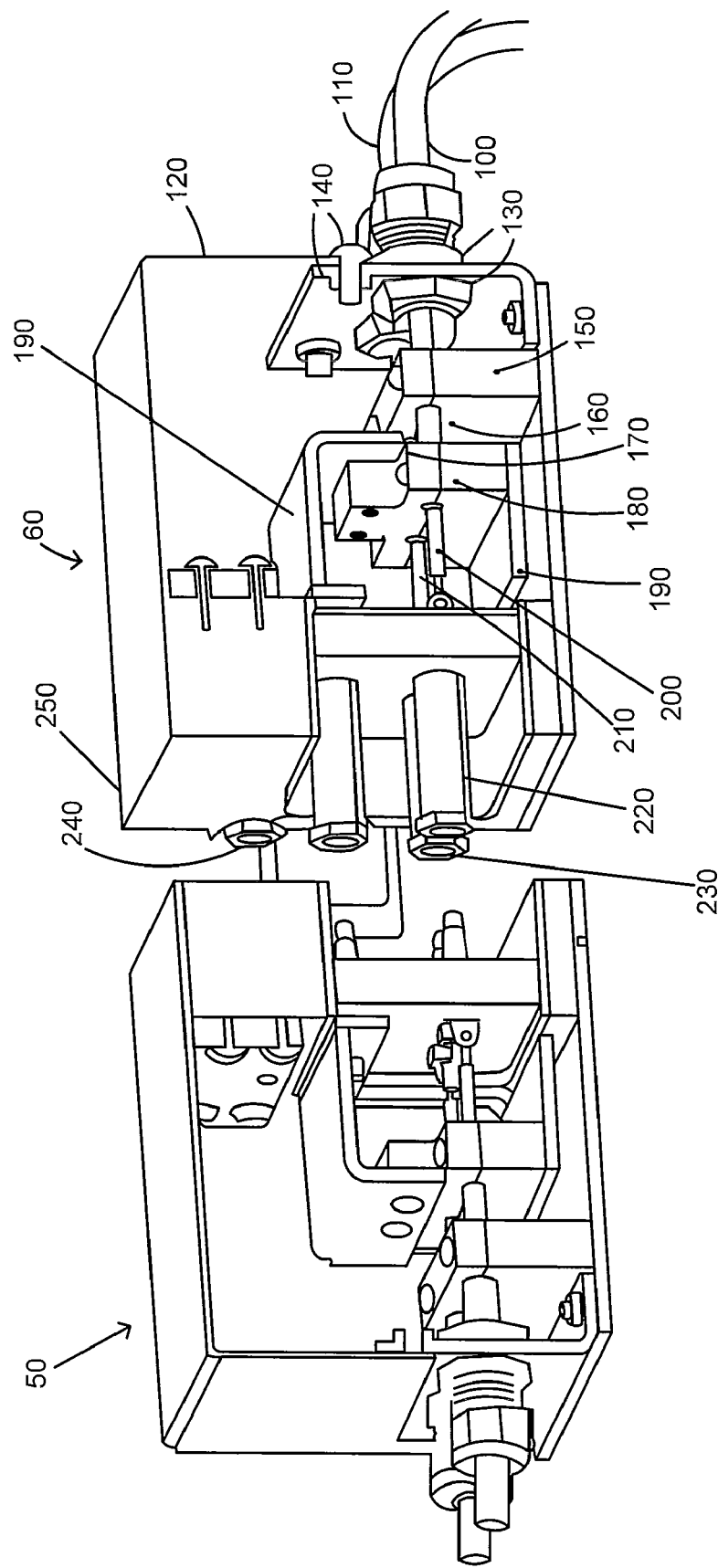
FIG. 5 illustrates a interconnection for a probe station.

Referring to FIG. 5, a pair of insulated conductors 100, 110 are interconnected to a conductive housing 120 of the female adapter 60. Each of the insulated conductors 100, 110 are preferably triaxial conductors and rated for at least 1,500 volts (or co-axial conductors and rated for at least 3,000 volts). Depending on the particular configuration, co-axial and/or tri-axial conductors may likewise be used having lower rating capabilities, and in particular low-noise low voltage cables. The shield conductor 130, 140 of each triaxial conductor 100, 110 is preferably interconnected to a conductive support 150. The conductors 100, 110 are preferably substantially straight between the outside of the enclosure and the conductive support 150, which reduces strain on the conductors 100, 110. The conductive support 150 is electrically connected with the conductive housing 120. The conductors 100, 110 are preferably supported by a pair of respective threaded rings 130, 140.

Normally the shield has a "ground" potential, so the shield conductors 130, 140 may be interconnected together by the conductive support 150 and/or the conductive housing 120. The conductive housing 120 preferably surrounds all, or substantially surrounds all, of the connectors enclosed therein. In this manner, the ground potential may be provided to the conductive housing 120 which provides, at least in part, a low noise interconnection environment for the signal connectors. In addition, the conductive support 150 and/or the conductive housing 120 are sufficiently spaced apart from the remaining guard and signal paths such that high power measurements, high voltage and/or high current, may be performed without arcing or other safety issues.

With the shield conductors 130, 140 electrically interconnected to the conductive support 150 and/or the conductive housing 120, the conductors 100, 110 extend further into the adapter 60 with the shield conductor 130, 140 (and exterior insulation, if any) being removed. The guard conductors 160, 170 of each of the triaxial conductors 100, 110 is preferably interconnected to a conductive support 180. The conductors 100, 110 are preferably substantially straight between the two aligned conductive supports 150, 180 which reduces strain on the conductors 100, 110. The conductive support 180 is electrically connected to a conductive inner housing 190. The inner housing 190 provides an inner enclosure around the signal conductor. In addition, the conductive support 180 and/or the conductive inner housing 190 are sufficiently spaced apart from the remaining signal paths and ground paths such that high power measurement, high voltage and/or high current, may be performed without arcing or other safety issues.

Typically the guard has a "guard" potential, so the guard conductors 160, 170 may be interconnected together by the conductive support 180 and/or the inner housing 190. The inner housing 190 preferably surrounds all, or substantially surrounds all, of the connectors enclosed therein. In this manner, the guard potential may be provided to the inner housing 190 which provides, at least in part, a low noise interconnection environment for the signal connectors.

With the guard conductors 170, 180 electrically interconnected to the conductive support 180 and/or the inner housing 190, the conductors 100, 110 extend further into the adapter 60 with the guard conductors 170, 180 (and external insulation, if any) being removed. The remaining signal conductors 200, 210 (with or without associated insulation) are preferably each connected to a respective connector 220, 230. The signal conductors 200, 210 are preferably substantially straight between the conductive support 180 and the respective signal connectors 220, 230, which reduces strain on the conductors 100, 110. The signal connectors 220, 230 provide an interconnection between the female adapter 60 and the male adapter 50.

The female adapter 60 includes a guard connector 240 that is electrically interconnected to the inner housing 190. In this manner, the guard potential may be provided in a suitable manner for interconnecting with the male connector 50. The signal connectors 220, 230 are preferably arranged in a spaced apart arrangement where the space between the connectors is approximately at least the diameter of one of the signal connectors. In addition, the guard connector 240 is preferably in a spaced apart arrangement from the connectors 220, 230 where the space between the signal/guard connectors is approximately at least twice the diameter of one of the signal connectors. In general, preferably the spacing between the signal connectors is less than the spacing between the respective signal connectors and the guard connector. This spacing arrangement increases the signal integrity.

The female adapter 60 includes a shield connector 260 that is electrically interconnected to the housing 120. In this manner, the shield potential may be provided in a suitable manner for interconnecting with the male connector 50. The shield connector 260 is preferably arranged in a spaced apart arrangement from the guard connector 240 where the space between them is approximately at least the diameter of one of the signal connectors. This spacing arrangement increases the signal integrity.

The adapters 50, 60 provide a low resistance connection and a low noise environment for signals combining high voltage and high current. The connection can conduct continuous direct current up to approximately 50 Amps (A) and one millisecond pulses at a 20 Hz pulse rate of approximately 1000 A with a resistance less than 1 milliohm.

In a low noise probing situation, typically tri-axial connectors are used and the signal conductors pass through the female adapter 60 while simultaneously maintaining a shielding environment and a guarded environment for signal integrity. Likewise in a high power probing situation, a high voltage probing situation, and/or a high current probing situation, typically a co-axial connector is used and the signal conductors similarly pass through the female adapter 60, in a relatively safe spaced apart arrangement, while simultaneously providing a grounded signal path through the "guard" connector. In such a high power probing situation, the shield connection may not be used, or otherwise the shield connection may be used while the guard connection is not used.

Ultra low noise measurement using especially low-currents are typically performed with two conductive paths ("force" and "sense") either reaching the test site independently ("true Kelvin" connection) or joining together in the proximity of the test site ("quasi Kelvin" connection) to form a "signal path." The force path, whose test equipment terminus has a relatively low impedance, is provided with a particular current. The sense path, whose test equipment terminus has a very high impedance, measures the voltage at the test site. As such, the current versus voltage characteristics of the test device can be obtained using the force and sense paths. This test configuration is desirable because although small variations in current are being measured, the amount of current directed to the test site might be large enough so that there is a significant voltage drop through the signal line leading to the test site. The distance from the test site to the point at which the signal path splits into force and sense path is a determinant of test quality, referred to in the low-current test industry as the degree to which the test configuration approaches the ideal "true kelvin" configuration in which the force and sense paths are connected by the conductive test site itself. Collectively, the force and sense paths are referred to as the signal path(s). The female adapter 60 and the male adapter 50 are configured such that the connection maintains the ability to perform a "true" or "quasi" Kelvin connection, as desired.

The male adapter 50 has a corresponding configuration as the female adapter 60, with the connectors being correspondingly modified. The male adapter 50 is typically secured to the probe station so that it is maintained in a secured position. In addition, the cables from the male adapter 50 are typically interconnected to suitable probes and/or the chuck in a desired configuration. In this manner, the male adapter 50 and associated cables do not need to be modified often, if ever. This reduces the time for probing by reducing the time required to set up a particular test for probing.

Other male and/or female adapters may be provided. Preferably alternative male adapters 60 are provided so as to maintain compatibility with the exiting female adapter 50. For example, the male adapter may include a single coaxial cable where the two signal paths are shorted together which increases the power carrying capability of the adapter. For example, the male adapter may include one or more co-axial cables where the shield is electrically connected to the guard which increases the guarding and/or shielding of the adapter. For example, the coaxial connector may use the shield connection and the signal connection, omitting the guard connection.

In some case it is desirable to have connectors that can withstand higher voltage and/or higher amperages of a coaxial or tri-axial test up to 10,000 volts or more and/or 50 amps or more (pulsed). In addition, it is desirable to have a connector that is easily configurable among a variety of biasing conductions, such as (1) shorted, (2) open, (3) tri-axial, and (4) coaxial configuration for biasing the chuck without the need to modify the cabling between the connector and the probe station. In addition, it is desirable to be able to select among different measurement types, such as (1) BNC connection, (2) tri-axial connection, (3) and coaxial connection all using the same enclosure.

Figure 6:
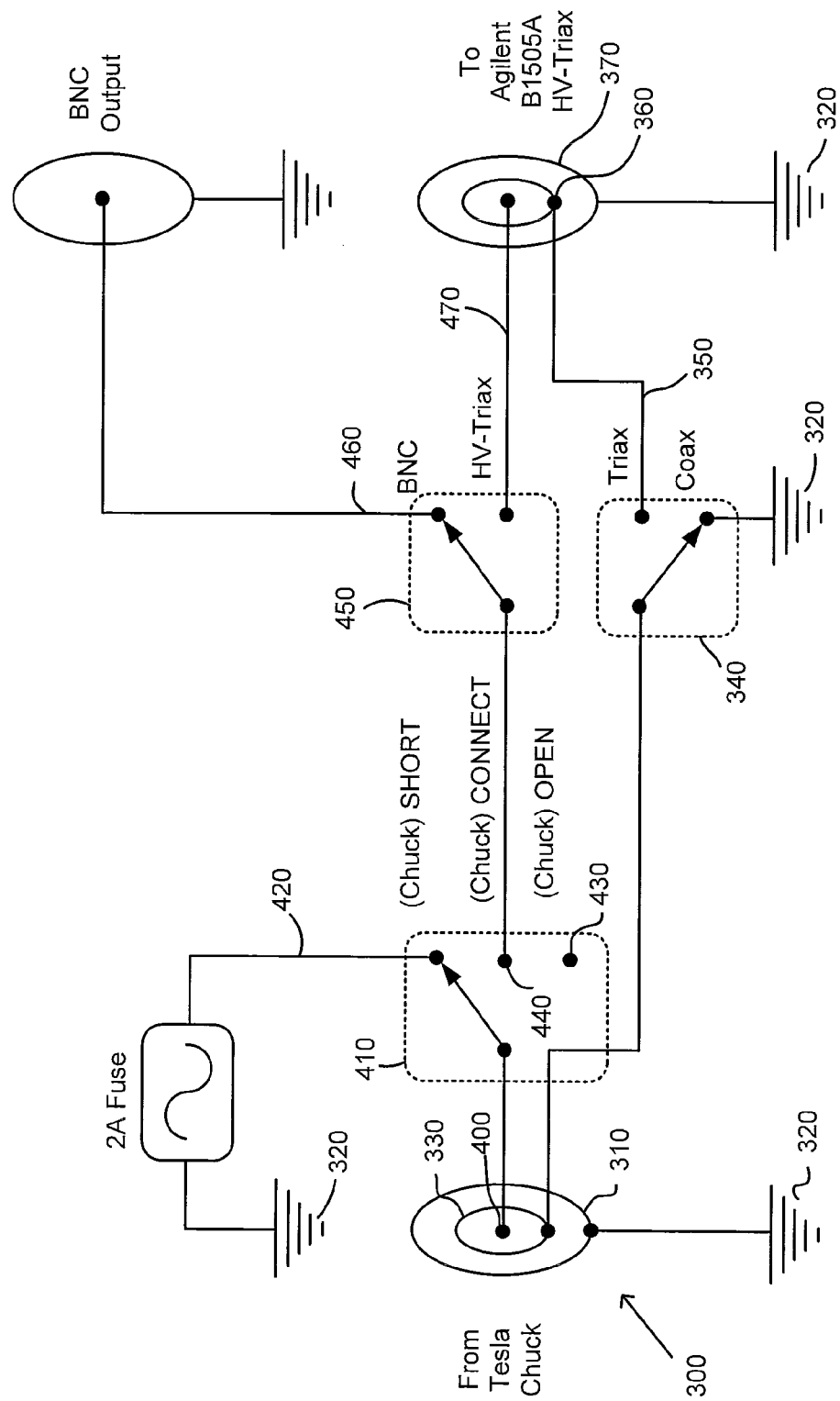
FIG. 6 illustrates another interconnection arrangement.

Referring to FIG. 6, a wiring diagram for one signal path for an integral adapter is illustrated. For a pair of signal paths, such as two cables from a test instrumentation, the wiring diagram is duplicated. The signal path from the chuck is preferably a tri-axial connection 300. The tri-axial connection 300 has a signal path (e.g., force or sense), a guard conductor, and a shield conductor. This provides flexibility in the test being performed. The shield conductor 310 is preferably grounded 320. The guard conductor 330 is connected to a switch 340 that selects between the ground connection 320 and a tri-axial connection 350. The tri-axial connection 350 is interconnected to a guard connection 360 of the output connector to the test instrumentation. The shield conductor 370 of the output connector is connected to the ground 320. In this manner, the guard potential/connection from the chuck may be selectively provided to the guard potential/connection of the output connector, or otherwise the guard potential/connection is grounded.

The tri-axial connection 300 has a signal path 400 which is connected to a switch 410 that selects between a shorted connection 420 to ground 320 (preferably through a fuse), an open connection 430, and a connected connection 440. The shorted connection 420 facilitates measurements when one of the connections should be shorted, which is also useful for calibration. The open connection 430 facilitates measurements when one of the connections should be opened, which is also useful for calibration. The connected connection 440 is connected to a switch 450 that selects between a BNC connection 460 (or other connection, typically co-axial in nature) and a tri-axial connection 470. In this manner, the signal path from the chuck may be selectively shorted, opened, or passed through to a desired connector.

If desired, the shield connection may likewise be provided from the chuck connector to the output connector, so that the shield potential may be a different ground, the chuck ground, or otherwise the test instrumentation ground, as desired. Also, if desired the adapter may include a data connection where remote commands may be used to select the position of the switches.

Figure 7:
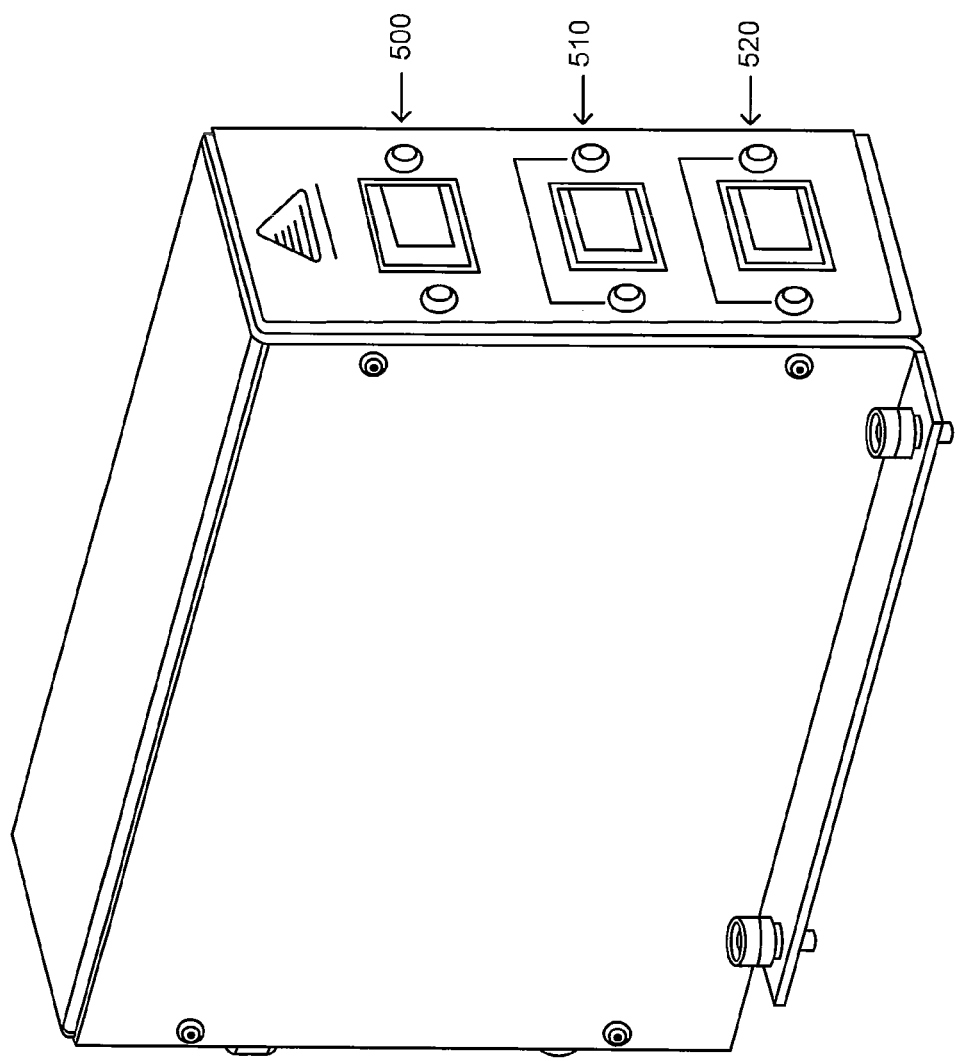
FIG. 7 illustrates an enclosure for the interconnection of FIG. 6.
Figure 8:
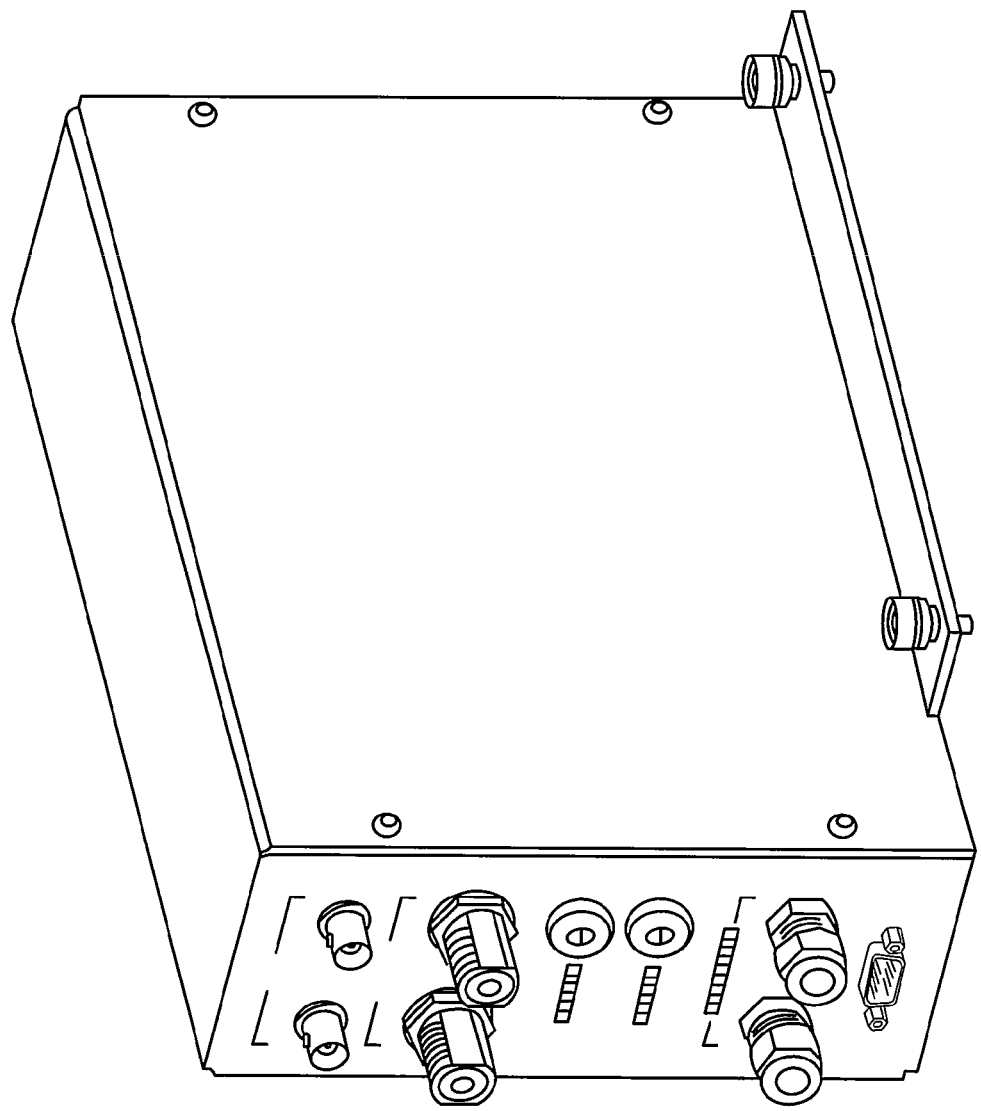
FIG. 8 illustrates the connectors for the enclosure of FIG. 7.

Referring to FIG. 7, an exemplary integral adapter is illustrated. A tri-position switch 510 may be included to control the position of the switch 410. A pair of dual position switches 500, 520 may be included to control the position of the switches 340, 450. This provides a convenient manner of controlling the switching positions. Referring also to FIG. 8, a suitable set of connectors may likewise be included together with a data port.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A low noise connector for a pair of cables each cable having a center conductor, a coaxial middle conductor encircling but conductively isolated from said center conductor, and a coaxial outer conductor encircling but conductively isolated from said middle conductor and said central conductor, said connector comprising:
   (a) a first adapter comprising:
      (i) a first center connector conductively connectable to said center conductor of a first cable;
      (ii) a first middle connector conductively connectable to said middle conductor of said first cable and conductively isolated from said first center connector;
      (iii) a first outer connector conductively connectable to said outer conductor of said first cable and conductively isolated from said first center connector and said first middle connector;
      (iv) a first inner housing conductively connectable to said first middle connector and conductively isolated from said first center connector and said first outer connector; and
      (v) a first outer housing conductively connectable to said outer conductor of said first cable and conductively isolated from said first center connector and said first middle connector; and
   (b) a second adapter arranged for engagement with said first adapter and comprising:
      (i) a second center connector conductively connectable to said center conductor of a second cable and arranged for mating engagement with said first center connector when said second adapter is engaged with said first adapter;
      (ii) a second middle connector conductively connectable to said middle conductor of said second cable and conductively isolated from said second center connector, said second middle connector arranged for mating engagement with said first middle connector when said second adapter is engaged with said first adapter;
      (iii) a second outer connector conductively connectable to said outer conductor of said second cable and conductively isolated from said second center connector and said second middle connector, said second outer connector arranged for mating engagement with said first outer connector when said second adapter is engaged with said first adapter;

(iv) a second inner housing conductively connected to said second middle connector and conductively isolated from said second center connector and said second outer connector, said second inner housing and said first inner housing arranged to substantially enclose said first center connector, said second center connector, said first middle connector and said second middle connector when said first adapter is engaged with said second adapter; and (v) a second outer housing conductively connectable to said outer conductor of said first cable and conductively isolated from said second center connector and said second middle connector, said second outer housing and said first outer housing arranged to substantially enclose said first inner housing, said second inner housing, said first outer connector and said second outer connector when said first adapter is engaged with said second adapter.

2. The low noise connector of claim 1 wherein said first center connector and said second center connector are connectable to conduct a signal between a probe station and an instrument.

3. The low noise connector of claim 1 wherein said first middle connector and said second middle conductor are connectable to a guard potential.

4. The low noise connector of claim 1 wherein said first outer connector and said second outer connector are connectable to a shield potential.

5. The low noise connector of claim 1 wherein a distance between said first center connector and said first outer connector is at least twice a diameter of said first center connector.

6. The low noise connector of claim 1 wherein a distance between said first middle connector and said first outer connector is at least equal to a diameter of said first center connector.

7. The low noise connector of claim 1 wherein said first adapter further comprises a third center connector conductively connected to said first center connector and arranged for mating engagement with a fourth center connector of said second adapter when said first adapter is engaged with said second adapter.

8. The low noise connector of claim 1 further comprising a conductive connection between said first inner housing and said first outer housing.

9. A low noise connector for four cables each cable having a center conductor, a coaxial middle conductor encircling but conductively isolated from said center conductor, and a coaxial outer conductor encircling but conductively isolated from said middle conductor and said central conductor, said connector comprising:

(a) a first adapter comprising:
  a first center connector conductively connectable to said center conductor of a first cable;
  (ii) a second center connector conductively connectable to said center conductor of a second cable;
  (iii) a first middle connector conductively connectable to said middle conductor of said first cable and said middle conductor of said second cable and conductively isolated from said first center connector and said second center connector;
  (iv) a first outer connector conductively connectable to said outer conductor of said first cable and said outer conductor of said second cable, said first outer connector conductively isolated from said first and said second center connectors and said first middle connector;
  (v) a first inner housing conductively connected to said first middle connector and conductively isolated from said first and said second center connectors and said first outer connector; and
  (vi) a first outer housing conductively connectable to said outer conductor of said first cable and said outer conductor of said second cable and conductively isolated from said first and said second center connectors and said first middle connector; and (b) a second adapter arranged for engagement with said first adapter and comprising:
  (i) a third center connector conductively connectable to said center conductor of a third cable and arranged for mating engagement with said first center connector when said second adapter is engaged with said first adapter;
  (ii) a fourth center connector conductively connectable to said center conductor of a fourth cable and arranged for mating engagement with said second center connector when said second adapter is engaged with said first adapter;
  (iii) a second middle connector conductively connectable to said middle conductor of said third cable and said middle conductor of said fourth cable and conductively isolated from said third center connector and said fourth center connector, said second middle connector arranged for mating engagement with said first middle connector when said second adapter is engaged with said first adapter;
  (iv) a second outer connector conductively connectable to said outer conductor of said third cable and said outer conductor of said fourth cable, said second outer connector conductively isolated from said third and said fourth center connectors and said second middle connector, said second outer connector arranged for mating engagement with said first outer connector when said second adapter is engaged with said first adapter;
  (v) a second inner housing conductively connectable to said second middle connector and conductively isolated from said third and said fourth center connectors and said second outer connector, said second inner housing and said first inner housing arranged to substantially enclose said first, said second, said third and said fourth center connectors, and said first and said second middle connectors when said first adapter is engaged with said second adapter; and
  (vi) a second outer housing conductively connectable to said outer conductor of said third cable and said outer conductor of said fourth cable and conductively isolated from said third and said fourth center connectors and said second middle connector, said second outer housing and said first outer housing arranged to substantially enclose said first and said second inner housings and said first and said second outer connectors when said first adapter is engaged with said second adapter.

10. The low noise connector of claim 9 wherein said first center connector and said third center connector are connectable to conduct a signal between a probe station and an instrument.

11. The low noise connector of claim 9 wherein said first middle connector and said second middle conductor are connectable to a guard potential.

12. The low noise connector of claim 9 wherein said first outer connector and said second outer connector are connectable to a shield potential.

13. The low noise connector of claim 9 wherein a distance between said first center connector and said first outer connector is at least twice a diameter of said first center connector and wherein a distance between said second center connector and said first outer connector is at least twice said diameter of said first center connector.

14. The low noise connector of claim 9 wherein a distance between said first middle connector and said first outer connector is at least equal to a diameter of said first center connector.

15. The low noise connector of claim 9 wherein a distance between said first center connector and said second center connector is at least equal to a diameter of said first center connector.

16. The low noise connector of claim 9 wherein a distance between said first middle connector and said first center connector is at least equal to a diameter of said first center connector and a distance between said first middle connector and said second center connector is at least equal to said diameter of said first center connector.

* * * * *

UNITED STATES PATENT AND TRADEMARK OFFICE
CERTIFICATE OF CORRECTION

PATENT NO.       : 8,167,648 B2   Page 1 of 1
APPLICATION NO.  : 13/030961
DATED            : May 1, 2012
INVENTOR(S)      : Kazuki Negishi et al.

It is certified that error appears in the above-identified patent and that said Letters Patent is hereby corrected as shown below:

Column 7, Line 58, before "a first center connector conductively connectable to said" please insert --(i)--.

Signed and Sealed this
Twenty-sixth Day of June, 2012

David J. Kappos
*Director of the United States Patent and Trademark Office*

UNITED STATES PATENT AND TRADEMARK OFFICE
CERTIFICATE OF CORRECTION

PATENT NO. : 8,167,648 B2
APPLICATION NO. : 13/030961
DATED : May 1, 2012
INVENTOR(S) : Kazuki Negishi et al.

It is certified that error appears in the above-identified patent and that said Letters Patent is hereby corrected as shown below:

Column 7, Line 13, after "said outer conductor of said" please delete "first" and insert --second--.

Signed and Sealed this
Ninth Day of October, 2012

David J. Kappos
*Director of the United States Patent and Trademark Office*